(12) United States Patent
Farnworth et al.

(10) Patent No.: US 7,105,437 B2
(45) Date of Patent: Sep. 12, 2006

(54) METHODS FOR CREATING ELECTROPHORETICALLY INSULATED VIAS IN SEMICONDUCTIVE SUBSTRATES

(75) Inventors: Warren M. Farnworth, Nampa, ID (US); Dale W. Collins, Boise, ID (US); Steven M. McDonald, Star, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/266,837

(22) Filed: Nov. 4, 2005

(65) Prior Publication Data

US 2006/0063377 A1    Mar. 23, 2006

Related U.S. Application Data

(63) Continuation of application No. 10/230,678, filed on Aug. 29, 2002.

(51) Int. Cl.
*H01L 21/4763* (2006.01)

(52) U.S. Cl. .................. 438/639; 257/E23.011

(58) Field of Classification Search .............. 438/597, 438/618, 639; 257/701, 678, E23.011
See application file for complete search history.

(56) References Cited

U.S. PATENT DOCUMENTS

| | | | |
|---|---|---|---|
| 4,715,941 A | 12/1987 | Jones et al. | |
| 4,755,585 A | 7/1988 | Hanson et al. | |
| 5,372,848 A | 12/1994 | Blackwell et al. | |
| 5,699,613 A | 12/1997 | Chong et al. | |
| 5,758,413 A * | 6/1998 | Chong et al. | ........... 29/852 |
| 5,939,206 A * | 8/1999 | Kneezel et al. | ........... 428/480 |
| 5,998,292 A * | 12/1999 | Black et al. | ........... 438/618 |
| 6,063,445 A | 5/2000 | Stolk | |
| 6,136,707 A | 10/2000 | Cohen | |
| 6,143,616 A | 11/2000 | Geusic et al. | |
| 6,157,081 A | 12/2000 | Nariman et al. | |
| 6,187,666 B1 | 2/2001 | Singh et al. | |
| 6,198,168 B1 | 3/2001 | Geusic et al. | |
| 6,285,001 B1 | 9/2001 | Fleming et al. | |
| 6,309,957 B1 | 10/2001 | Tu et al. | |
| 6,313,531 B1 | 11/2001 | Geusic et al. | |
| 6,323,121 B1 | 11/2001 | Liu et al. | |

\* cited by examiner

*Primary Examiner*—Bradley K. Smith
(74) *Attorney, Agent, or Firm*—TraskBritt

(57) ABSTRACT

Methods are provided for creating lined vias in semiconductor substrates. Using electrophoretic deposition techniques, micelles of a lining material are deposited on the wall of the via, reacting with the surface of the wall until the entire wall is covered by the lining material. The lining material is then fixed in place to form a layer lining the via. The lined via may then be filled with a desired material. For example, a via lined with an insulative material may be filled with a material such as copper to create an insulated conductive via through the substrate.

20 Claims, 3 Drawing Sheets

METHODS FOR CREATING ELECTROPHORETICALLY INSULATED VIAS IN SEMICONDUCTIVE SUBSTRATES

CROSS-REFERENCE TO RELATED APPLICATION

This application is a continuation of application Ser. No. 10/230,678, filed Aug. 29, 2002, now U.S. Pat. No. 7,030,010, issued Apr. 18, 2006.

FIELD OF THE INVENTION

The present invention relates generally to the field of integrated circuits including a semiconductive substrate, such as a silicon wafer or chip, with vias formed therethrough and, more particularly, although not necessarily limited to, integrated circuits that include insulated vias filled with conductive material and methods for their fabrication.

BACKGROUND OF THE INVENTION

In order to function, integrated circuits must be in electrical communication with signal inputs and outputs as well as power and ground connections external to the integrated circuit. For example, power and ground or other reference voltage must be supplied for operation of the integrated circuit, and other connections, such as for input, output and timing signals, may also be required. These connections are typically made through leads or other conductive elements connected to bond pads present on the surface of a die. Leads are typically connected to the bond pads by wire bonding, or welding a wire between a bond pad and an associated lead.

Conventionally, bond wires have an arc-like shape extending out from the active surface of the semiconductor die. The size, shape and length of these wires may impair the optimum operation of some integrated circuits due to resistance of the wire material, inductive effects of the wires and inconsistencies in wire lengths.

U.S. Pat. No. 6,198,168 to Geusic et al. represents one attempt to deal with the foregoing problem. The Geusic-type integrated circuits feature conductively filled vias that extend through a wafer or die. Each via is connected to bond pads at both surfaces of the die, allowing a metallization layer connected to a bond pad at one surface to be in electrical communication with a lead connected to the bond pad on the opposite surface. Such a design eliminates the need for wirebonds in close proximity to the integrated circuit. However, the transmission of an electrical current through the conductively filled vias creates an inductive effect within the die that may impair the function of the integrated circuit. The Geusic-type devices attempt to minimize this effect by oxidizing the wall surfaces of the via to provide an electrically insulating oxide coating prior to filling the via. While this approach reduces the inductive effect of a current through the die, it fails to completely eliminate it, especially where alternating current is applied.

Another approach to creating a lined via is to create a via through a substrate and then deposit a layer of dielectric material (or other desired material) over the surface of the substrate and into the via. The deposited layer is then removed down to the surface of the substrate, leaving only the material deposited in the via. This removal may be accomplished by an abrasive removal technique such as polishing, by chemical removal techniques such as etching, or by other suitable techniques. One example of the foregoing approach is disclosed in U.S. Pat. No. 6,157,081 to Nariman et al., the disclosure of which is hereby incorporated by reference herein in its entirety. The Nariman et al. deposition technique can be problematic as deposition of the dielectric material occurs on every exposed surface of the substrate. Further, the thickness of the dielectric material on the sidewalls of a via cannot be precisely controlled. Where the deposited dielectric material is relatively viscous and/or the diameter of the via is relatively small, the dielectric material may "pinch off" and form a plug at or near a mouth of the via at the surface of the substrate. This plug may extend only partway down the via. Such vias are then unusable, as either they are blocked by the dielectric material or they contain uncoated sidewall sections. Even where the technique is successful, the thickness of the coating can vary significantly along the sidewalls of the via, resulting in a similar variability in its dielectric or conductive properties.

BRIEF SUMMARY OF THE INVENTION

The present invention includes methods and processes for creating lined vias in semiconductor substrates, as well as semiconductor substrates having lined vias created by the inventive methods. Using electrophoretic techniques, micelles of a lining material are deposited on the walls of the via, reacting with the surface of the wall until the entire wall is covered by the lining material. The lining material is then fixed in place to form a layer lining the via. The lined via may then be filled with another desired material. For example, a via lined with a dielectric material may be filled with a conductive material such as copper to create a conductive via extending through the substrate and electrically isolated from the surrounding substrate material.

BRIEF DESCRIPTION OF THE SEVERAL VIEWS OF THE DRAWINGS

In the drawings, which, in conjunction with the accompanying text, disclose the best mode presently known to the inventors for carrying out the present invention.

DETAILED DESCRIPTION OF THE INVENTION

The present invention provides methods for creating lined vias in semiconductor substrates, as well as the semiconductor substrates having lined vias created by those methods. It will be appreciated by those skilled in the art that the embodiments herein described, while illustrating certain specific and exemplary embodiments, are not intended to limit the invention or the scope of the appended claims. Those of ordinary skill in the art will also understand that various combinations or modifications of the disclosed embodiments may be made without departing from the scope of the invention.

Figure 1:
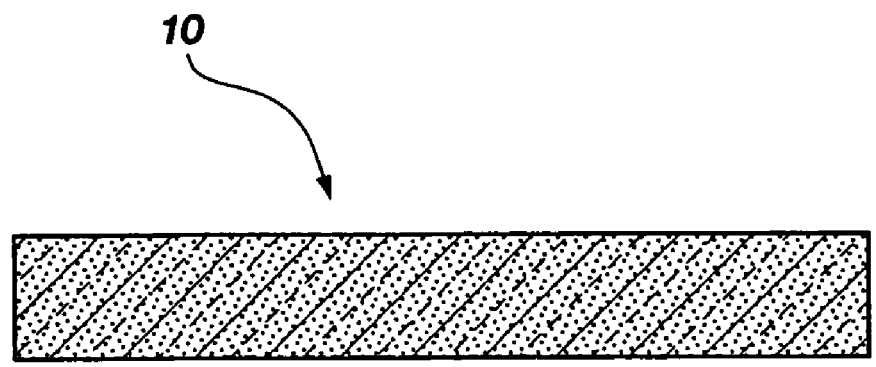
FIG. 1 is a side view of a semiconductor substrate useful in practicing methods in accordance with the present invention.

Turning to FIG. 1, there is depicted a semiconductor substrate 10. The substrate 10 may comprise primarily silicon, as formed in the art by growing a single crystal wafer in the form of a cylinder, which is then segmented or sliced. Alternatively, another bulk semiconductor substrate may be employed, such as a silicon on sapphire (SOS) substrate or a silicon on glass (SOG) substrate, or other type of silicon on insulator (SOI) substrate. The active surface of the semiconductor substrate may then be doped, in accordance with techniques well known in the art. For example, a P-type substrate may be used. It will be appreciated that other suitable semiconductor substrates may be used, such as N-type substrates or even non-silicon semiconducting substrates such as gallium arsenide or indium phosphide, where appropriate electrophoretic and chemical reactions may be designed. All such alternative structures and associated methods of via lining are within the scope of the present invention.

Figure 2:
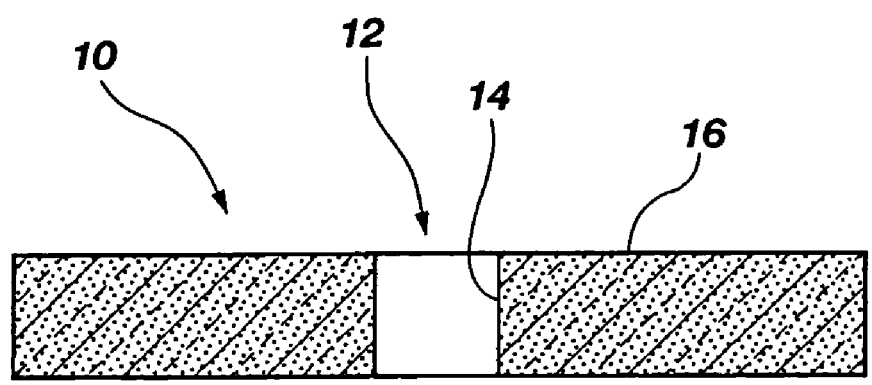
FIG. 2 is a side view of the semiconductor substrate of FIG. 1, after a via has been created therein.

FIG. 2 shows the semiconductor substrate 10 of FIG. 1 with a via 12 formed therein. While the via 12 is depicted as passing entirely through the semiconductor substrate 10, it will be appreciated that vias 12 which do not pass entirely through the substrate but merely penetrate to a selected depth therein may be created and used in methods in accordance with the present invention. It will be further appreciated that, although, for simplicity of understanding, only a single via 12 is shown, the methods of the present invention may be, and in most instances would be, simultaneously conducted with multiple vias 12 in a common semiconductor substrate. It will also be appreciated by those of ordinary skill in the art that the methods of the present invention will typically be applied on a wafer or other bulk semiconductor substrate scale for efficiency, although the invention is not so limited.

Via 12 may be created in any suitable fashion. Such a via 12 may be formed by drilling, by laser ablation, or by any other suitable method known in the art. Laser ablation may be effected using any suitable equipment, such as the Model 5000-series lasers, offered currently by Electro Scientific Industries, Inc. (ESI) of Portland, Oreg. One specific, suitable piece of equipment is a 355 nm wavelength UV YAG laser, ESI Model 2700, which maybe used to form vias as little as 25 µm in diameter. One hundred pulses using this laser will form a 750 µm deep via through silicon. Another suitable laser is the Model 200, offered by Xsil Limited of Dublin, Ireland. If desired, a TMAH (tetramethyl ammonium hydroxide) solution may be used to clean the via, which can result in a squared cross-section for the via.

Alternatively, via 12 may be formed by etching the semiconductor substrate 10 with a suitable etchant. Where via 12 is formed by etching, additional acts, including the application and patterning of an etchant-resistive material such as a photoresist material to top surface 16 of the semiconductor substrate 10, followed by etching with a suitable wet or dry etchant, may be required. Any other suitable method for forming a via 12 in a semiconductor substrate 10 known, now or in the future, to those of ordinary skill in the art may be used and is within the scope of the present invention. Via 12 may be of substantially round cross-section, or otherwise, as noted above.

One other nonlimiting example of a suitable technology for forming the via 12 is the so-called atmospheric downstream plasma (ADP) process offered by Tru-Si Technologies, Inc. of Sunnyvale, Calif. As applied to via formation, the ADP process is implemented using an aluminum mask layer formed over the active surface of a semiconductor substrate patterned with apertures to define via locations. An argon carrier gas is employed, with fluorine as the reactant gas. The etch effected is substantially isotropic.

Once the via 12 is created and, if necessary, cleaned, the sidewall 14 of via 12 will be exposed. While the term "sidewall" is employed sometimes herein in conjunction with a via 12 of round cross-section, the term includes vias 12 where distinct sidewalls joining at an angle, or vias of other cross-sections, are formed. Where semiconductor substrate 12 is a silicon substrate, sidewall 14 may have a porous surface that is primarily silicon. There may be small amounts of silicon oxide exposed on the surface of sidewall 14 as well. With silicon semiconductor substrates 10, the sidewall 14 will thus be semiconducting. Where necessary, the via 12 may be cleaned using any suitable process to provide a clean and porous surface at the sidewall 14.

Figure 3:
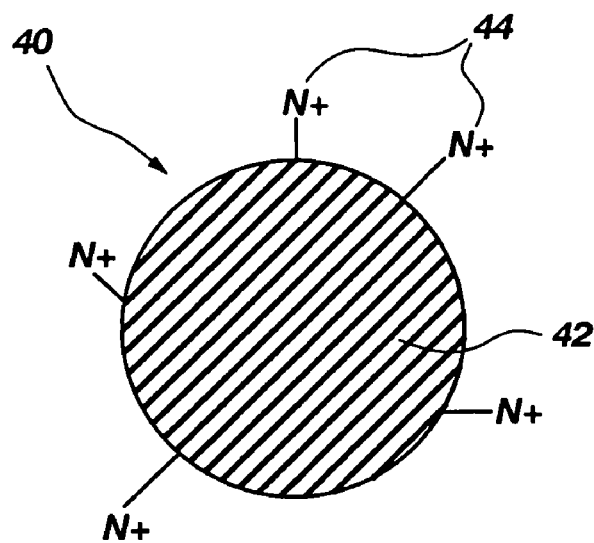
FIG. 3 is a representation of a polyimide micelle useful as a lining material in accordance with some embodiments of methods of the present invention.

Turning to FIG. 3, there is shown an illustration of a lining material micelle 40 that may be useful in practicing some of the methods in accordance with the present invention. In one exemplary embodiment, the lining material micelle 40 comprises a polymer 42 that has a globular conformation with charged functional groups 44 disposed on the surface thereof to allow for ionic deposition. It will be appreciated that lining material micelles 40 may comprise any suitable lining material for the desired application. For example, micelles of conductive polymers may be utilized to create vias lined with a conductive material for certain applications. Alternatively, a lining material micelle 40 created from a polymer 42 with electroinsulative (dielectric) properties may be deposited to form a dielectric film. It will be appreciated that the charged functional group 44 will vary depending on the specific polymer 42 that is selected for use as lining material micelles 40.

One example of a suitable polymer 42 is Electrodepositable Polyimide (E-PI), available from JSR Microelectronics of Sunnyvale, Calif. Micelles 40 of E-PI have electroinsulative properties and are modified by positively charged amine groups, disposed on the surface thereof, as charged functional group 44, allowing for cationic deposition. Other potentially suitable polymers 42 include the EAGLE® 2100 ED and PEPR® 2400 electrodepositable photoresists available from Shipley Company, LLC, Marlborough, Mass. Of course, it will be appreciated that any other suitable polymer may be selected and utilized.

Figure 4:
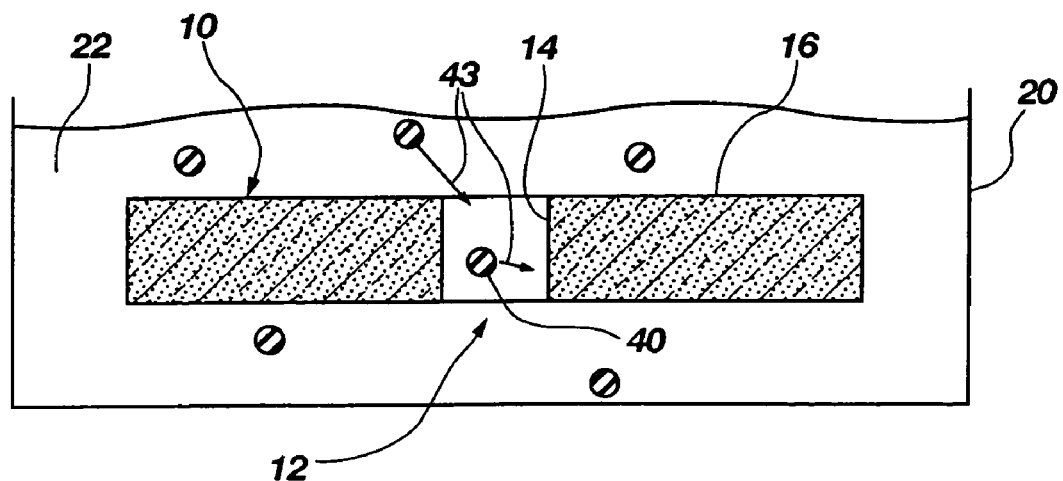
FIG. 4 is a side view of a representation of the semiconductor substrate of FIG. 2 undergoing an electrophoretic deposition of lining material.

Turning to FIG. 4, the electrodeposition of micelles 40 on the sidewalls 14 of via 12 is illustrated. Electrophoretic deposition may be accomplished using any standard electrophoretic technique known now, or in the future, to those of ordinary skill in the art. For example, the semiconductor substrate 10 may be placed in an electrophoretic bath and an electric current then applied through the semiconductor substrate 10. This may be accomplished by immersing the semiconductor substrate 10 in a reservoir 20 containing a bath solution 22 or by providing the semiconductor substrate 10 as a surface (such as a bottom surface) of the reservoir 20. The bath solution 22 may be any suitable fluid with micelles 40 suspended therein. Any fluid (whether liquid or gaseous) capable of suspending the micelles 40 therein and allowing the micelles 40 to be electrodeposited therefrom may be used. The micelles 40 are drawn towards the semiconductor substrate 10 and into the via 12 as shown by arrows 43 by passage of the electric current. With doped semiconductor substrates 10 such as P-type substrates, the current may be applied directly through the semiconductor substrate 10. A lining material micelle 40 that contacts the sidewall 14 is deposited thereon as the functional groups 44 interact with the surface of the sidewalls 14. One embodiment of such an interaction would be the attachment of a positively charged amine functional group 44 to the bare silicon sidewall 14 of a via 12 extending at least partially through a silicon semiconductor substrate 10. As the surface of the sidewall 14 is covered by micelles 40 deposited thereon, the micelles 40 coalesce to form a layer of lining material 32 (shown in FIG. 5 and discussed further in connection therewith).

The micelles 40 continue to deposit on the sidewall 14 until the sidewall 14 of each via 12 is completely covered by a lining material layer 32 of the polymer 42. In embodiments where the lining material layer 32 is electrically insulating, the deposition is self-limiting, ceasing once the sidewalls 14 are uniformly covered with the lining material layer 32, as no additional micelles 40 are drawn thereto. Thus, the insulative property of the lining material layer 32 prevents further lining material micelle 40 deposition, resulting in a relatively uniform thickness throughout the lining material layer 32. Similarly, the micelles 40 are only deposited on the exposed conducting silicon portions of the semiconductor substrate 10, such as the sidewalls 14. Other surfaces of semiconductor substrate 10, such as the top surface 16 (which may comprise the active surface of the semiconductor substrate 10), may be provided with nonconductive coatings and will not be deposited upon as no micelles 40 will be drawn thereto.

Examples of suitable nonconductive coatings include passivating layers of silicon oxide, insulative photoresists capable of being stripped off in subsequent processing steps, insulative materials such as polyimides which are left in place during subsequent processing, or any other suitable non-conductive material capable of being applied as a coating to a surface of the semiconductor substrate 10. For example, a passivating layer of polyimide, silicon oxide, or other dielectric material may be placed over the top surface 16 of a semiconductor substrate 10 prior to forming the via 12 with a laser. The passivating layer prevents deposition of the lining material micelles 40 on the top surface 16. Alternatively, a removable nonconductive material, such as a nonconductive photoresist, may be applied to the top surface 16, either before or after the formation of the via 12. Once the lining material micelles 40 have been deposited, the removable material may be stripped off to accommodate further processing. The deposition of lining material micelles 40 of polymer 42 can thus be both selective for the vias 12 only and create a relatively uniform layer of lining material 32 therein. Of course, it will be appreciated that, where desired, a lining material layer may be formed on conductive areas of the top surface 16 by deposition of lining material micelles 40 thereon.

Figure 5:
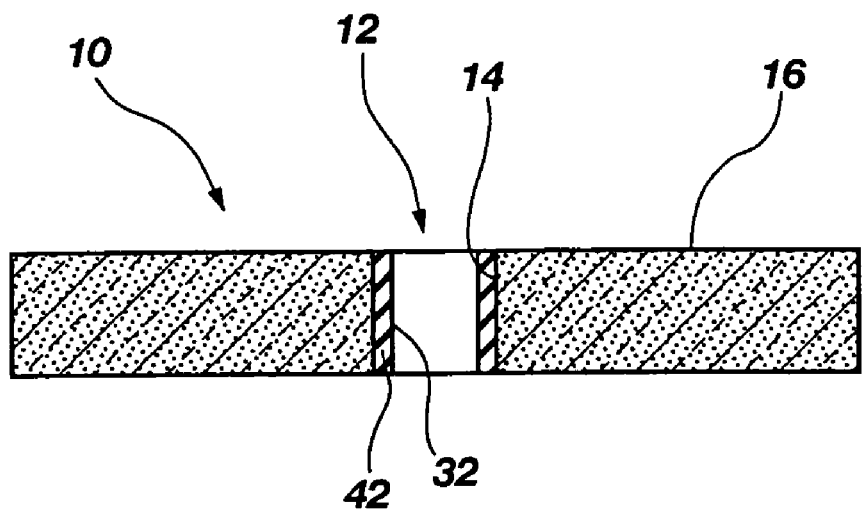
FIG. 5 is a side view of a semiconductor substrate having a via with a lining in accordance with the present invention.

FIG. 5 depicts the semiconductor substrate 10 with the lining material layer 32 of polymer 42 disposed on the sidewalls 14 of the via 12. The lining material layer 32 is cured to form a continuous film. With a suitable polymer 42, the cure results in cross-linking throughout the lining material layer 32, which may increase the adhesion of the lining material layer 32 to the sidewalls 14. The lining material layer 32 may be cured in any suitable fashion for the polymer 42 used. For example, the polymer 42 may be heat cured by baking the substrate. Other curing methods, such as chemical curing or photocuring, may be used when appropriate for the selected polymer 42. Of course, it will be appreciated that, where appropriate for the polymer 42 selected and the planned use, the curing process may be omitted.

Figure 6:
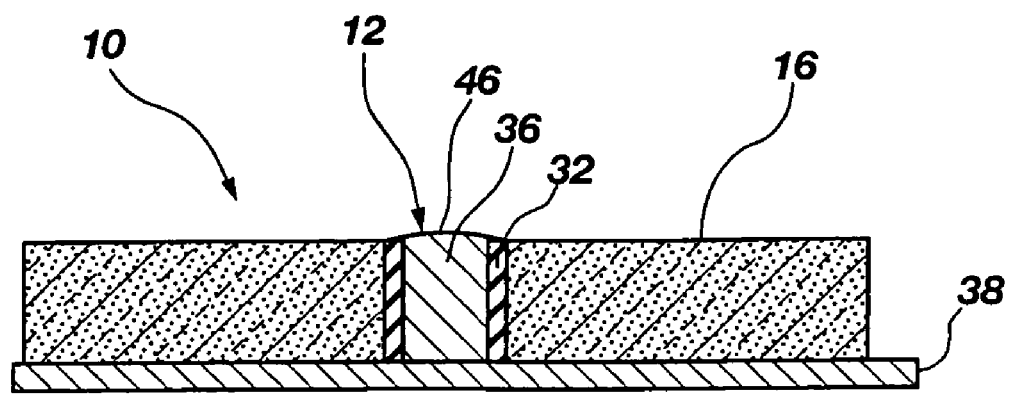
FIG. 6 is a side view of the semiconductor substrate of FIG. 5 after undergoing a filling step to create a conductive stud through the via.

Once the lining material layer 32 is cured, if needed, the lined via 12 may then be readied for use. For example, the lined via 12 may be filled with a conductive material 36 to create a conductive via 12 electrically insulated from the surrounding material of semiconductor substrate 10, as shown in FIG. 6. Suitable conductive materials may include copper, aluminum, other metals, or a conductive or conductor-filled polymer such as an epoxy, among others. The lining material layer 32 may need to undergo one or more preparation steps to facilitate bonding of conductive material 36 thereto. For example, polymeric films are often roughened prior to the formation of a metal layer bonded thereto. Whether the metal layer is deposited using electroless or electrophoretic techniques, the "roughening" has been found to increase the adhesion between the metal and the polymer.

A number of different techniques for roughening a polymer surface, including the surface of a thin film polymer, to improve the adhesion of a metal thereto are known to those of ordinary skill in the art. These techniques include treating the polymer surface with oxygen plasma, argon plasma, or sulfur trioxide vapor, exposing the polymer to a caustic etch followed by an acid quench, or treating the polymer with a halogenated organic solvent, among others. These techniques leave open bonds on the polymer 42 surface to which the metal can attach during deposition. Any suitable roughening technique that can be adapted for treating the surface of the lining material layer 32 selected may be used. Selection of a suitable technique may require consideration of the stage of manufacture, additional structures present or absent from the substrate, and compatibility with the remainder of the process. Treatment with plasmas maybe especially adaptable as controlled exposure of the entire surface of the lining material layer 32 within the via 12 can be achieved.

Following any desired, or required, preparation steps, the conductive material 36 may be deposited in the via 12 using any suitable technique. For example, where appropriate, a conductive material 36 (such as copper) may be applied using an electrodeposition process. A conductor 38 may be placed adjacently underneath the semiconductor substrate 10, which is inserted into a bath (or forms a surface of the reservoir providing the bath) containing a copper solution, such as copper sulfate. The conductor 38 may be a plate forming the bottom surface of the bath, such as a steel plate. Alternatively, the conductor 38 may be any desired conductive element of any desired shape in contact with semiconductor substrate 10. Current is then applied through the solution and through semiconductor substrate 10 to conductor 38 to deposit the copper from the solution onto the exposed portion of conductor 38 at the bottom of the via 12 to fill the via 12 and create conductive stud 46 therein. Once the conductive stud 46 is created, the conductor 38 is removed from the semiconductor substrate 10. This removal may be facilitated by coating the conductor 38 with a suitable release agent, such as a wax, that allows current to pass therethrough at the bottom of via 12, but does not strongly adhere to the deposited conductive material 36 formed over the layer of lining material 32 on sidewall 14 and filling via 12.

Any other alternative method for filling the via 12 with a conductive material 36 may be used and is within the scope of the present invention. For example, a seed layer of a conductive metal, such as copper or aluminum, may be deposited on the sidewall 14 of via 12 using a suitable technique. Suitable techniques for depositing the seed layer include sputtering, PVD, and CVD. The conductive material 36 may then be electrochemically deposited on the seed layer, filling the via. Alternatively, the via 12 may be filled using an electroless process. The surface of the polymer 42 of lining material layer 32 may be treated to provide a suitable site for deposition, as by treatment with a dilute caustic, such as 1–2% NaOH or KOH, solution. The semiconductor substrate 10 may be immersed in a metal salt solution under acidic conditions to fill via 12 with metal that deposits out of the solution. It will be appreciated that any other suitable electroless techniques may be used and are within the scope of the present invention. Conductive materials other than metals may also be used to create the conductive stud 46. For example, the via 12 may be filled with a conductive polymer, as by depositing micelles of a conductive polymer using an electrophoretic deposit technique, or with a conductive or conductor-filled epoxy.

Of course, it will be appreciated that the via 12 may be filled as part of a single-step damascene process, or a dual damascene process. A conventional damascene process is a method of forming a channel filled with conductive metal on a substrate, typically by patterning with photolithography and dielectric material, then filling the recesses with conductive metal, such as copper or aluminum. Excess metal may then be removed by polishing, leaving the channels filled with inlaid metal. A dual damascene process forms two layers of metal (wiring line and contact studs) in one step, where a single damascene process involves multiple steps and can leave an interface between the layers. Examples of damascene processes may be found in U.S. Pat. No. 6,309,957 to Tu et al., issued Oct. 30, 2001, and U.S. Pat. No. 6,187,666 to Singh et al., issued Feb. 13, 2001, the disclosure of each of which patents is incorporated herein by reference in its entirety. Any additional steps required for such a process, including the preparation of the top surface 16 for patterning by application of resists or otherwise, may be performed as needed.

It will be appreciated that methods and processes in accordance with the teachings of the present invention for forming lined vias may be integrated into existing processes for manufacturing integrated circuits in any suitable fashion. For example, a lined via may be formed prior to forming circuitry. Alternatively, a lined via may be formed after the creation of circuitry, using laser ablation to form the via through any layers, including protective layers formed on a substrate. Various acts used to create a lined via may be performed in connection with other processes as well. For example, a dual damascene process may be used to create a connective stud through a lined via simultaneously with the formation of wiring lines. Alternatively, the electrodeposition of insulative lining material micelles on the sidewall of a via may occur at the same time such insulative material is deposited on a surface of the substrate to create an insulated area, or layer, thereon. All such modifications and integrations are within the scope of the present invention.

It will be apparent that details of the processes and methods herein described can be varied considerably without departing from the concept and scope of the invention. The claims alone define the scope of the invention as conceived and as described herein.

What is claimed is:

1. A method of lining a via in a semiconductor substrate, comprising:
   providing a semiconductor substrate comprising at least one via therein;
   exposing the at least one via to a solution comprising insulating material micelles, the insulating material micelles comprising polymers having a globular conformation with charged functional groups disposed on a surface of the polymers; and depositing the insulating material micelles on at least one sidewall of the at least one via to form an insulating layer thereon.

2. The method of claim 1, wherein providing a semiconductor substrate comprising at least one via therein comprises forming at least one via in the semiconductor substrate, the at least one via comprising a via opening accessible from at least a first surface of the semiconductor substrate and at least one sidewall beginning at the first surface of the semiconductor substrate and extending into the semiconductor substrate to define a bore of the at least one via.

3. The method of claim 2, wherein forming at least one via in the semiconductor substrate comprises forming at least one via extending from the first surface of the semiconductor substrate to a second surface of the semiconductor substrate.

4. The method of claim 3, wherein forming at least one via extending from the first surface of the semiconductor substrate to a second surface of the semiconductor substrate comprises forming a first via opening accessible on the first surface of the semiconductor substrate and forming a second via opening accessible on the second surface of the semiconductor substrate, the at least one sidewall extending from the first surface at the first via opening to the second surface at the second via opening to define the bore of the at least one via.

5. The method of claim 1, wherein exposing the at least one via to a solution comprising insulating material micelles comprises exposing the at least one via to a solution comprising micelles of a polyimide having electrically insulating properties.

6. The method of claim 1, wherein depositing the insulating material micelles on at least one sidewall of the at least one via to form an insulating layer thereon comprises forming bonds between the charged functional groups and the at least one sidewall of the at least one via.

7. The method of claim 1, wherein depositing the insulating material micelles on at least one sidewall of the at least one via to form an insulating layer thereon comprises applying an electric current through the semiconductor substrate to cause the insulating material micelles to deposit on the at least one sidewall of the at least one via.

8. The method of claim 1, wherein depositing the insulating material micelles on at least one sidewall of the at least one via to form an insulating layer thereon comprises forming a photosensitive insulating layer.

9. The method of claim 1, wherein depositing the insulating material micelles on at least one sidewall of the at least one via to form an insulating layer thereon comprises forming a heat-sensitive insulating layer.

10. The method of claim 1, further comprising curing the insulating layer to form an insulating film coating the at least one sidewall of the at least one via.

11. The method of claim 10, wherein curing the insulating layer to form an insulating film coating the at least one sidewall of the at least one via comprises exposing the insulating layer to a suitable setting chemical source to cross-link the charged functional groups in the insulating material micelles.

12. The method of claim 10, wherein curing the insulating layer to form an insulating film coating the at least one sidewall of the at least one via comprises exposing a photosensitive insulating layer to light conditions appropriate to cure the photosensitive insulating layer.

13. The method of claim 10, wherein curing the insulating layer to form an insulating film coating the at least one sidewall of the at least one via comprises exposing a heat-sensitive insulating layer to temperature conditions appropriate to cure the heat-sensitive insulating layer.

14. The method of claim 1, further comprising depositing a conductive material within the at least one via.

15. The method of claim 14, wherein depositing a conductive material within the at least one via comprises filling the at least one via with the conductive material to create a conductive stud within the at least one via and extending at least partially through the semiconductor substrate.

16. The method of claim 1, further comprising depositing a seed layer of conductive material within the at least one via.

17. The method of claim 1, further comprising coating a first surface of the semiconductor substrate with an insulative material prior to exposing the at least one via in the semiconductor substrate to the solution comprising the insulating material micelles.

18. The method of claim 17, wherein coating a first surface of the semiconductor substrate with an insulative material prior to exposing the at least one via to the solution comprising the insulating material micelles comprises coating the first surface of the semiconductor substrate with an insulative material prior to forming the at least one via.

19. The method of claim 17, wherein coating a first surface of the semiconductor substrate with an insulative material prior to exposing the at least one via to the solution comprising the insulating material micelles comprises coating at least a portion of the first surface with an insulative photoresist.

20. The method of claim 17, wherein coating a first surface of the semiconductor substrate with an insulative material prior to exposing the at least one via to the solution comprising the insulating material micelles comprises coating at least a portion of the first surface with an insulative polyimide.

* * * * *